US006623653B2

(12) United States Patent
Furuta et al.

(10) Patent No.: US 6,623,653 B2
(45) Date of Patent: Sep. 23, 2003

(54) SYSTEM AND METHOD FOR ETCHING ADJOINING LAYERS OF SILICON AND INDIUM TIN OXIDE

(75) Inventors: Gaku Furuta, San Jose, CA (US); Apostolos Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 228 days.

(21) Appl. No.: 09/881,390

(22) Filed: Jun. 12, 2001

(65) Prior Publication Data

US 2002/0185466 A1 Dec. 12, 2002

(51) Int. Cl.$^7$ .............................................. H01L 21/302
(52) U.S. Cl. ............................ 216/24; 216/67; 216/72; 216/75; 216/76
(58) Field of Search .............................. 216/67, 72, 75, 216/76, 24

(56) References Cited

U.S. PATENT DOCUMENTS

| 4,933,296 | A | * | 6/1990 | Parks et al. .................... 438/30 |
| 5,286,337 | A | | 2/1994 | Tsou .......................... 1156/643 |
| 5,318,664 | A | * | 6/1994 | Saia et al. ..................... 216/67 |
| 5,607,602 | A | | 3/1997 | Su et al. ....................... 216/76 |
| 5,667,631 | A | | 9/1997 | Holland et al. ................. 216/13 |
| 5,843,277 | A | | 12/1998 | Goto et al. ................ 156/643.1 |
| 5,959,312 | A | * | 9/1999 | Tsai et al. ...................... 257/57 |
| 5,966,594 | A | * | 10/1999 | Adachi et al. ................ 438/151 |
| 6,458,494 | B2 | * | 10/2002 | Song et al. ...................... 430/5 |

* cited by examiner

*Primary Examiner*—Anita Alanko
(74) *Attorney, Agent, or Firm*—David C. Ripma; Matthew D. Rabdau; Scott C. Krieger

(57) ABSTRACT

A method has been provided for etching adjoining layers of indium tin oxide (ITO) and silicon in a single, continuous dry etching process. A conventional dry etching gas, such as HI, is used to etch ITO using RF or plasma energy. When the silicon layer underlying the ITO layer is reached, oxygen or nitrogen is added to etching gas to improve the selectivity of ITO to silicon. In some aspects of the invention an etch-stop layer is formed in the silicon layer. A specific example of fabricating a bottom gate thin film transistor (TFT) is also provided where adjoining layers of source metal, ITO, and channel silicon are etched in the same dry etch step.

21 Claims, 8 Drawing Sheets

US 6,623,653 B2

SYSTEM AND METHOD FOR ETCHING ADJOINING LAYERS OF SILICON AND INDIUM TIN OXIDE

BACKGROUND OF THE INVENTION

1. Field of the Invention

This invention generally relates to integrated circuit (IC) fabrication and, more particularly, to a system and method for reducing the number of processes involved in etching an indium tin oxide layer (ITO) adjoining a silicon (Si) layer.

2. Description of the Related Art

Liquid crystal displays (LCDs) are now commonly used in handheld devices such as mobile telephones and palm-sized computers. Further, the price and display resolution characteristics of LCDs continue to approach cathode ray tube (CRT) displays. To decrease the size of handheld LCDs and to improve the visual characteristics of desktop LCDs, the geometries of LCD structures must continue to decrease. Therefore, the feature resolution requirements in the formation of LCD structures, such as active matrix (AM) LCD pixels, continue to become more stringent.

ITO (indium tin oxide) is widely used as a material in the fabrication of AM LCD pixel electrodes. ITO dry etching has significant advantages in the controlled etching profiles and features when compared to the conventional ITO wet etching method. This difference is especially telling when the features, such as vias and line widths, are in the range of 3 microns (um), or less. ITO is a material that is difficult to dry etch, however, and study continues into methods to improve the conventional processes. Typically, a very high radio frequency (RF) power or plasma source is needed to perform the ITO dry etch. The problem with using high RF power occurs in the selective etching of the ITO underlayers. One convention ITO underlayer material is silicon. Silicon is common material used between the electrode metal layer and the transistor channel region. The problem is that a halogen ITO dry etching gas, such as $Cl_2$, HCl, HBr and HI, etches silicon at higher etching rate than ITO. Therefore, a process to intentionally etch ITO often unintentionally etches the underlying Si layer.

FIGS. 1–8 depict a conventional process for forming an amorphous silicon (a-Si) AM LCD bottom gate transistor 100 (prior art). The formation of a top gate transistor would be equivalent in most respects. In FIG. 1 a gate material has been deposited over a glass substrate 102 and patterned to form a gate region 104.

In FIG. 2 a gate insulator 200, such as $SiN_x$, is deposited. A layer of a-Si 202 is deposited over the gate insulator 200, and a layer of doped silicon 204, such as n+ Si, is deposited over the a-Si 202.

In FIG. 3 photoresist later 300 is deposited and patterned.

In FIG. 4 a dry etch is preformed to remove portions of the a-Si layer 202 and the n+ Si layer 204. Then, the photoresist 300 (not shown) is etched away.

In FIG. 5 a layer of ITO 500 material is deposited. A layer of source metal 502, such as Al or Ti, is deposited in a pattern over the ITO layer 500. A photoresist layer 504 is deposited over the metal layer 502 and patterned.

In FIG. 6 a dry etch is performed to remove the exposed metal layer 502 and a half ashing is preformed to clean the exposed ITO surface.

In FIG. 7 a wet etch is performed to remove the exposed ITO layer 500. Then, a stripping is performed to remove the remaining photoresist layer 504.

In FIG. 8 another dry etch is performed to remove the exposed n+ Si layer 204. Then, post-etch cleaning process is performed. Subsequent procedures complete the TFT panel fabrication.

It would be advantageous if ITO material could be etched in a dry etch process instead of a wet etch process.

It would be advantageous if the selectivity of ITO material to silicon could be improved.

It would be advantageous if the gases used to dry etch ITO could be made more selective with respect to silicon.

It would be advantageous if a transistor with adjoining layers of metal, ITO, and Si could be etched in a fewer number of process steps.

SUMMARY OF THE INVENTION

Accordingly, a method is provided for selectively etching adjoining film layers in the fabrication of a thin film transistor (TFT), such as might be used in an LCD. The method comprises: forming a first silicon layer; forming a second silicon layer overlying the first silicon layer; forming a layer of ITO overlying the second silicon layer; forming a metal layer overlying the ITO layer; forming a patterned photoresist mask overlying the metal layer; dry etching to remove the metal layer, the ITO layer, and the second silicon layer; and, forming an oxide or nitride etch-stop layer overlying the first silicon layer.

Dry etching includes the substeps of: a first dry etching in an atmosphere of mainly HI, HBr, HCl, HI and Ar, $Cl_2$ and He, $CF_3Cl$, $CF_2Cl_2$, $SiCl_4$, $SiBr_4$, or combinations of the above-mentioned gases to remove the metal layer, the ITO layer, and the second silicon layer; and, a second dry etch in an atmosphere of more than 10% oxygen, more than 10% nitrogen, or more than a 10% combination of oxygen and nitrogen, to promote the formation of the etch-stop layer in the first silicon layer.

Additional details of the selective ITO/Si etching method are provided below.

DETAILED DESCRIPTION OF THE PREFERRED EMBODIMENTS

Figure 9:
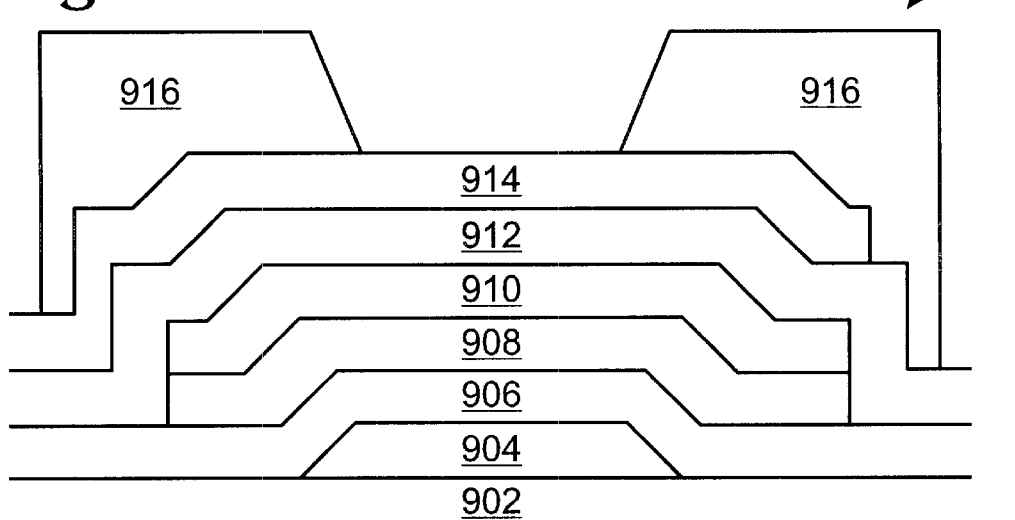
FIGS. 9–11 illustrate steps in present invention process of etching adjoining metal, ITO, and silicon layers in a continuous etching process.
Figure 10:
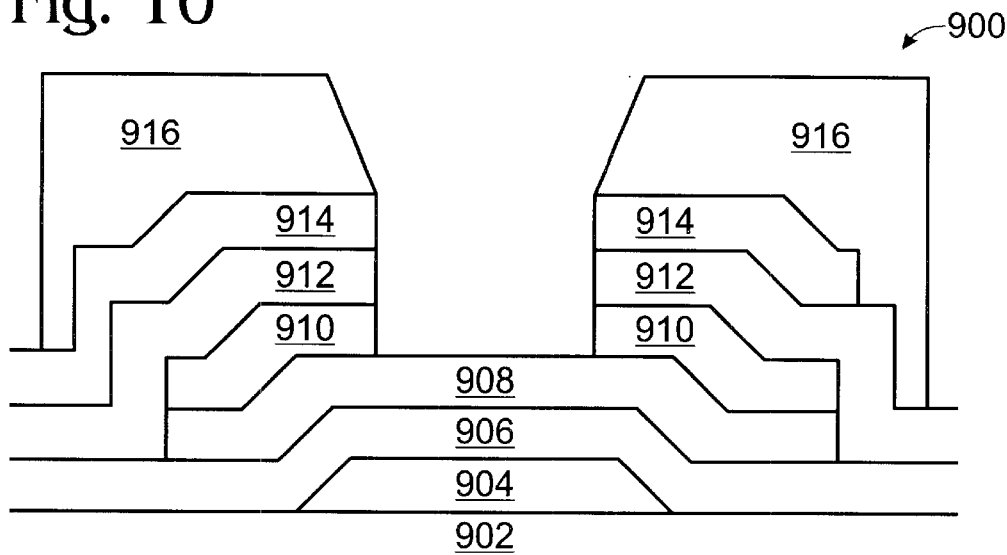
Figure 11:
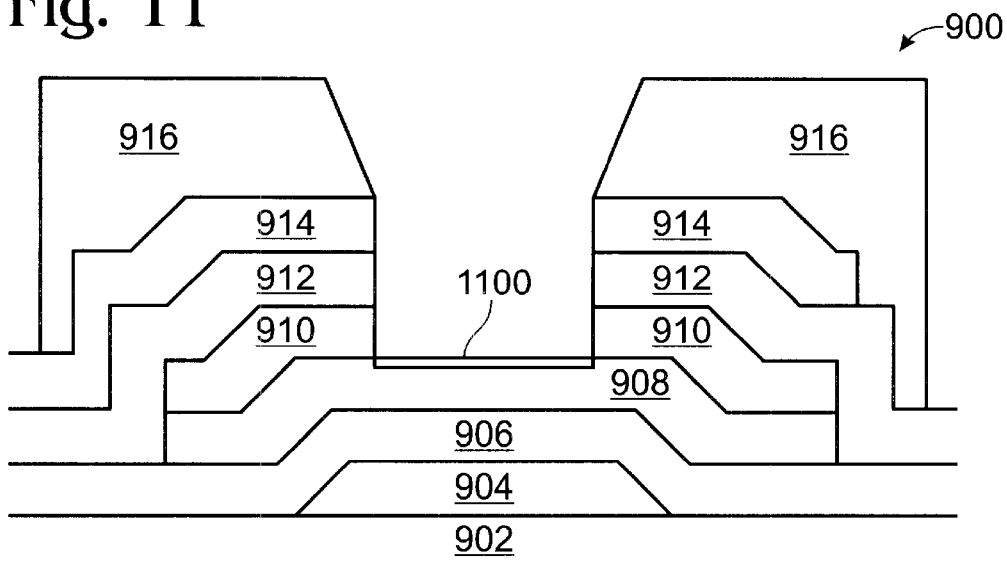

FIGS. 9–11 illustrate steps in present invention process of etching adjoining metal, ITO, and silicon layers in a continuous etching process. Such a process can be used in the fabrication of an integrated circuit thin film transistor 900. FIG. 9 depicts a glass substrate 902, with a gate region 904 overlying the glass substrate 902. A layer of gate insulator 906, such as SiNx, overlies the gate region 904, and a layer a-Si 908 overlies the gate insulator 906. Overlying the a-Si layer 908 is a doped layer of Si 910. Overlying the doped Si layer 910 is an ITO layer 912 and a metal source layer 914. A photoresist layer 916 has been deposited and patterned to expose an area of the metal layer 914. FIG. 9 is essentially the same device formed in the prior art process, FIGS. 1–5 described above. In some aspects of the invention the doped Si layer 910 is an n+ material. The present invention etching process is equally applicable to the formation of NMOS and PMOS transistors. Therefore, it would be within the skill of those practicing in the art to use other types of dopant, such as a p+ material.

Figure 1:
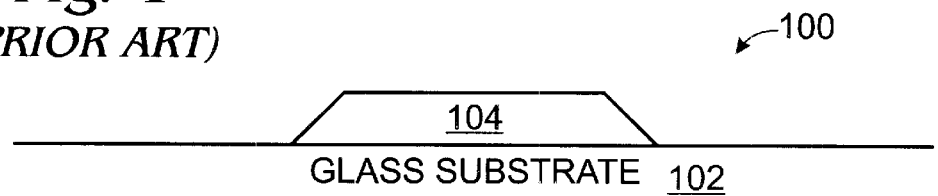
FIGS. 1–8 depict a conventional process for forming an amorphous silicon (a-Si) AM LCD bottom gate transistor (prior art).
Figure 2:
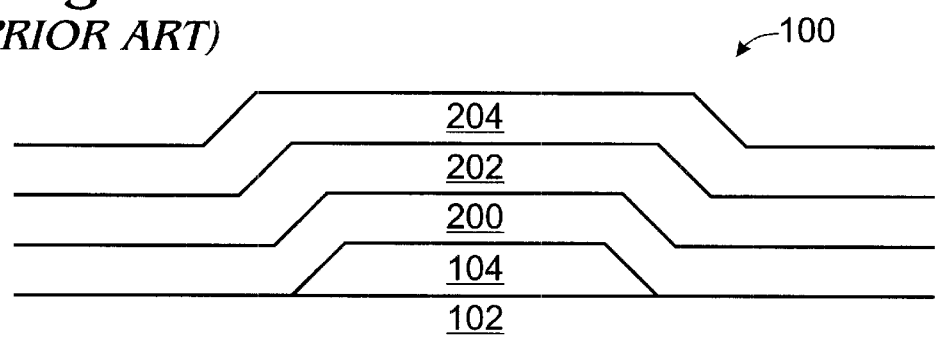
Figure 3:
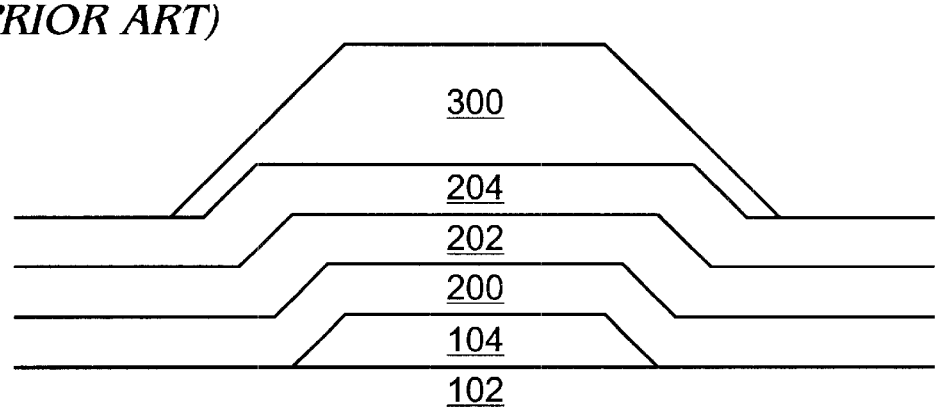
Figure 4:
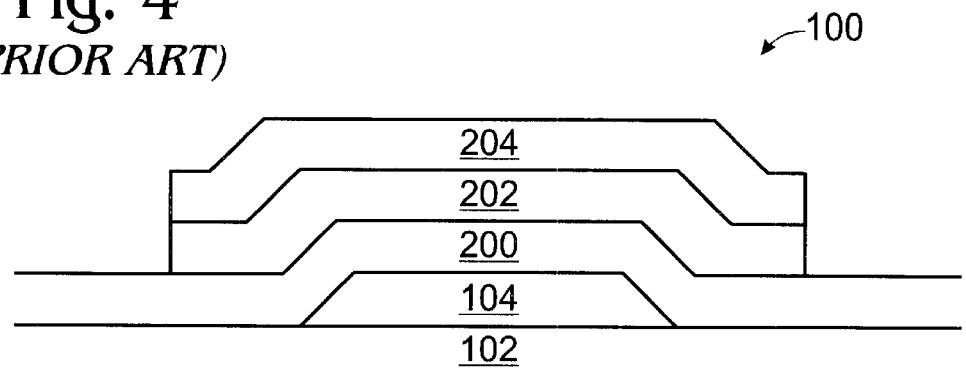
Figure 5:
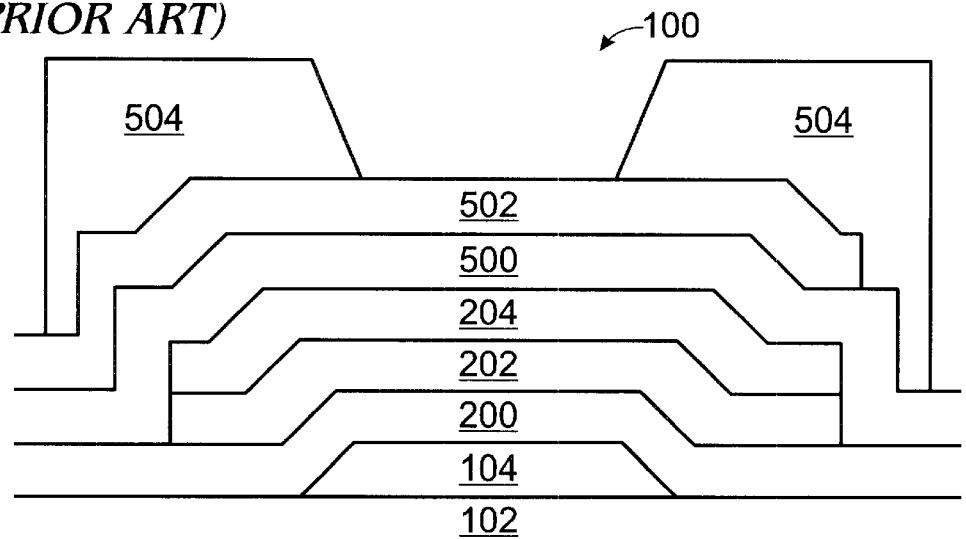
Figure 6:
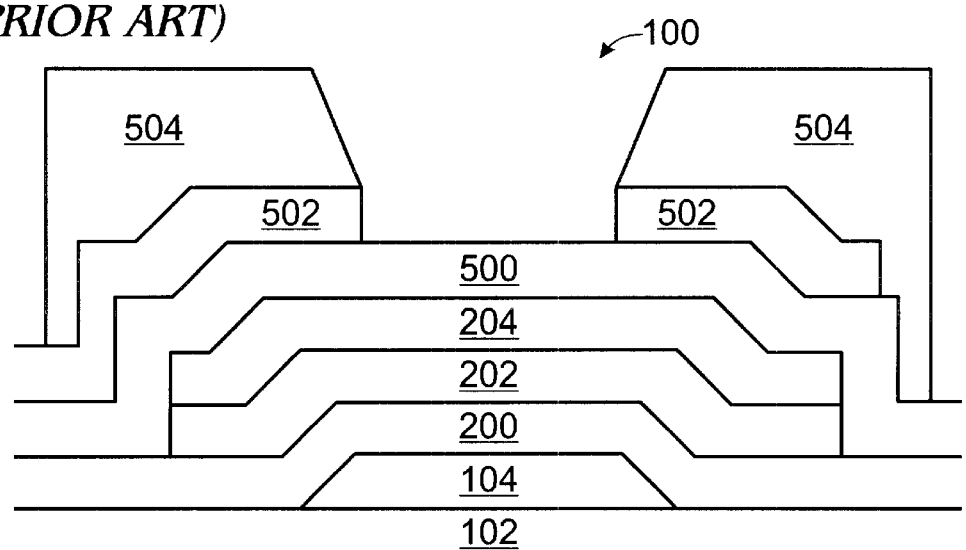
Figure 7:
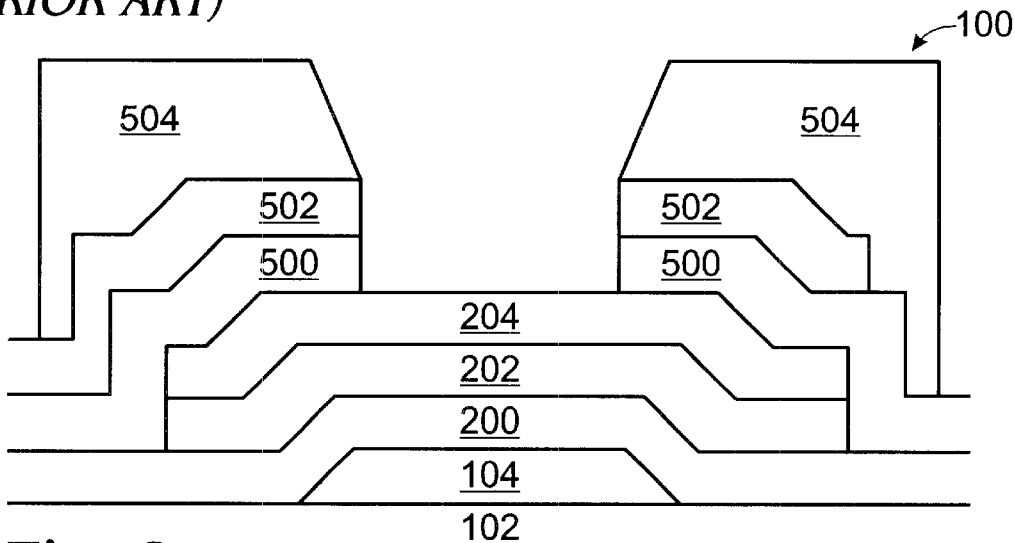
Figure 8:
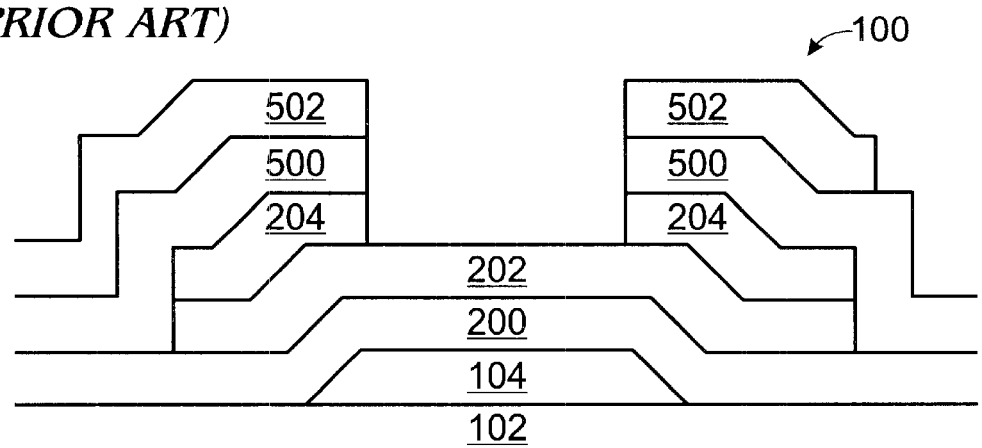

FIG. 10 depicts the results of the present invention dry etching process. A single dry etch process removes the metal layer 914 exposed by the patterned photoresist 916. In turn, the ITO layer 912, exposed by the removal of the metal layer 914, is etched. Likewise, the doped Si layer 910, exposed by the removal of the ITO layer 912, is etched. Thus, the etching that is conventionally preformed in three separate etch steps (see the description of FIGS. 6–8), is performed in a single process.

FIG. 11 depicts the formation of an etch-stop layer following, or continuous with the conclusion of the dry etch process shown in FIG. 10. An etch-stop layer 1100 can be formed in the a-Si layer 908, in the doped Si layer 910, or in the boundary of layers 908 and 910. As shown, the etch-stop 1100 is formed in a-Si layer 908. The etch-stop layer 1100 prevents the dry etching process from removing the exposed a-Si layer 908. Subsequent etch processes remove the thin etch-stop layer 1100 that is formed on the silicon surface. Such process could utilize a plasma of $SF_6$, $CF_4$, or other gas combinations that are well-known in the art. Similar to a conventional process of FIG. 8, subsequent process steps half-ash the photoresist 916 to partially remove part it, as plasma etching "hardens" the photoresist making it very difficult to remove by wet-process only. Subsequently, the remaining photoresist 916 is wet-stripped and, finally, the exposed surfaces are cleaned using steps similar to the conventional process.

Figure 12:
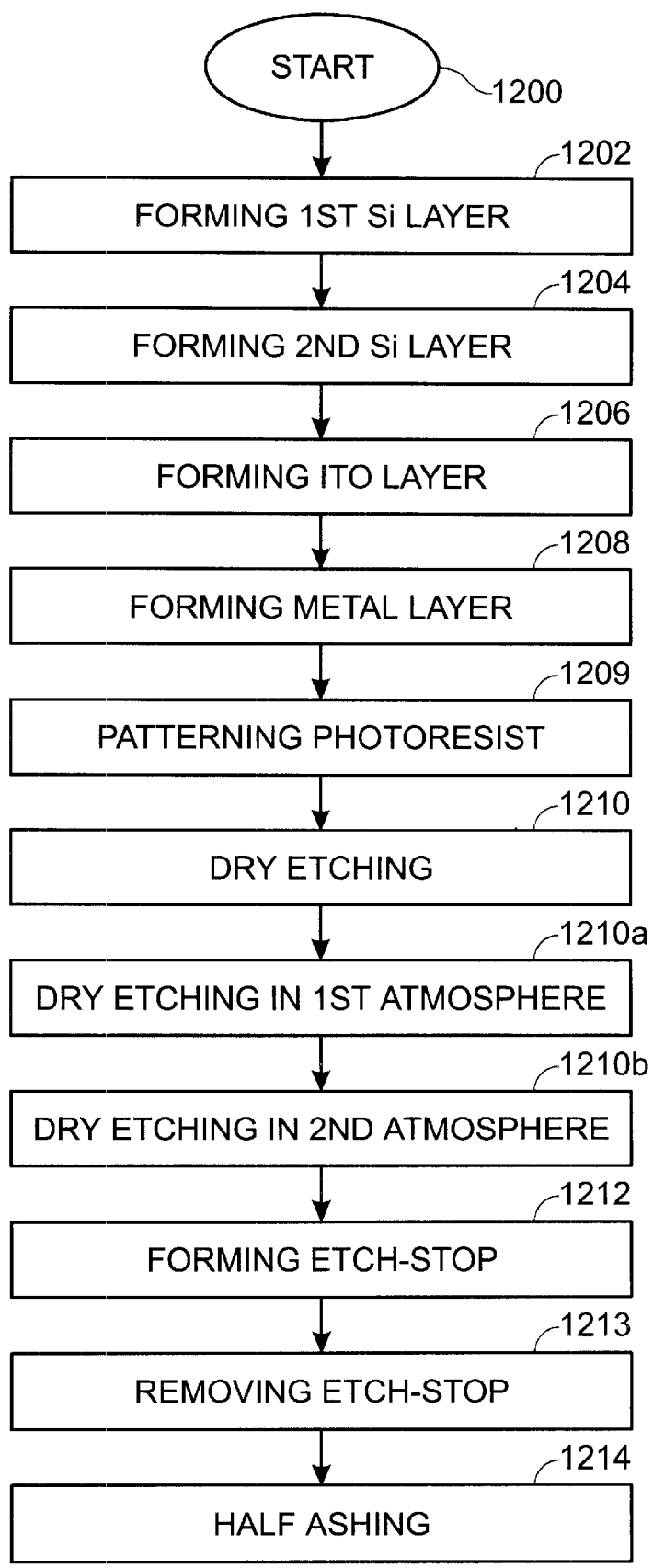
FIG. 12 is a flowchart illustrating the present invention method for etching adjoining film layers in the fabrication of an integrated circuit (IC) thin film transistor (TFT), or an LCD amorphous silicon (a-Si) TFT.

FIG. 12 is a flowchart illustrating the present invention method for etching adjoining film layers in the fabrication of an integrated circuit (IC) thin film transistor (TFT), or an LCD amorphous silicon (a-Si) TFT. The method describes the fabrication process of FIGS. 9–11 in more detail. Although the method of FIG. 12 is depicted as a sequence of numbered steps for clarity, no order should be inferred from the numbering unless explicitly stated. The method starts at Step 1200. Step 1202 forms a first silicon layer. In some aspects Step 1202 includes forming an amorphous silicon layer. Step 1204 forms a second silicon layer overlying the first silicon layer. In some aspects Step 1204 includes forming a doped microcrystalline silicon layer, such as Si doped with an n+ material. This layer can be annealed to promote microcrystalline structure.

Step 1206 forms a layer of indium tin oxide (ITO) overlying the second silicon layer. Step 1208 forms a metal layer overlying the ITO layer. In some aspects of the invention the metal layer is a source metal layer, but the same process would apply to the formation of a drain, or even a gate electrode in a top gate transistor structure. Step 1210 dry etches to remove the metal layer, the ITO layer, and the second silicon layer. Some aspects of the invention include as further step, Step 1212 forms an etch-stop layer overlying the first silicon layer. Alternately, but not shown, the etch-stop layer can be formed in the second silicon layer. Forming an etch-stop layer overlying the first silicon layer in Step 1212 typically includes minimally etching the first Si layer.

Step 1210, dry etching, includes substeps. Step 1210a dry etches in a first atmosphere to remove the metal layer, the ITO layer, and the second silicon layer. Step 1210b dry etches in a second atmosphere to promote the formation of the etch-stop layer in the first silicon layer. The dry etching of Step 1210b includes dry etching in a second atmosphere selected from the group of atmospheres including more than 10% oxygen, more than 10% nitrogen, and more than a 10% combination of oxygen and nitrogen. As used herein, gas percentages are defined as the percentage by volume in the gas feed. The dry etching in the first and second atmospheres in Steps 1210a and 1210b includes dry etching in an atmosphere selected from the group of dry etching gas atmospheres substantially (mainly) including HI, HBr, HCl, HI and Ar, $Cl_2$ and He, $CF_3Cl$, $CF_2Cl_2$, $SiCl_4$, $SiBr_4$, and combinations of the above-mentioned gases. The dry etching in the first and second atmospheres in Steps 1210a and 1210b includes dry etching with a process tool selected from the group including transform coupled plasma (TCP), inductively coupled plasma (ICP), and electron cyclotron resonance (ECR) tools. These tools provide either the RF or plasma energy needed to speedily etch the ITO.

In some aspects of the invention forming the etch-stop layer in Step 1212 includes forming an etch-stop layer from a material selected from the group including silicon dioxide ($SiO_2$) and silicon nitride.

In some aspects of the invention a further step, Step 1209, following the forming of the metal layer in Step 1208, patterns a layer of photoresist having an opening to expose a region of the metal layer. Then, dry etching in Step 1210 includes dry etching the exposed metal layer region, a region of the ITO layer underlying the exposed metal layer region, and a region of the second silicon layer underlying the ITO region.

Following the dry etching of the second atmosphere to promote the formation of an etch-stop layer in Step 1210b, Step 1213 etches to remove the etch-stop layer. Step 1213 includes etching with a plasma selected from the group including $CF_4$, $CF_3H$, $CF_2H_2$, and $SF_6$ plasma.

Step 1214 is a half ash process (plasma etching using O2 plasma) to partially remove the photoresist formed in Step 1209. Subsequent wet-stripping steps complete the removal of the photoresist. A bottom gate transistor is formed thereafter in a conventional manner.

Figure 13:
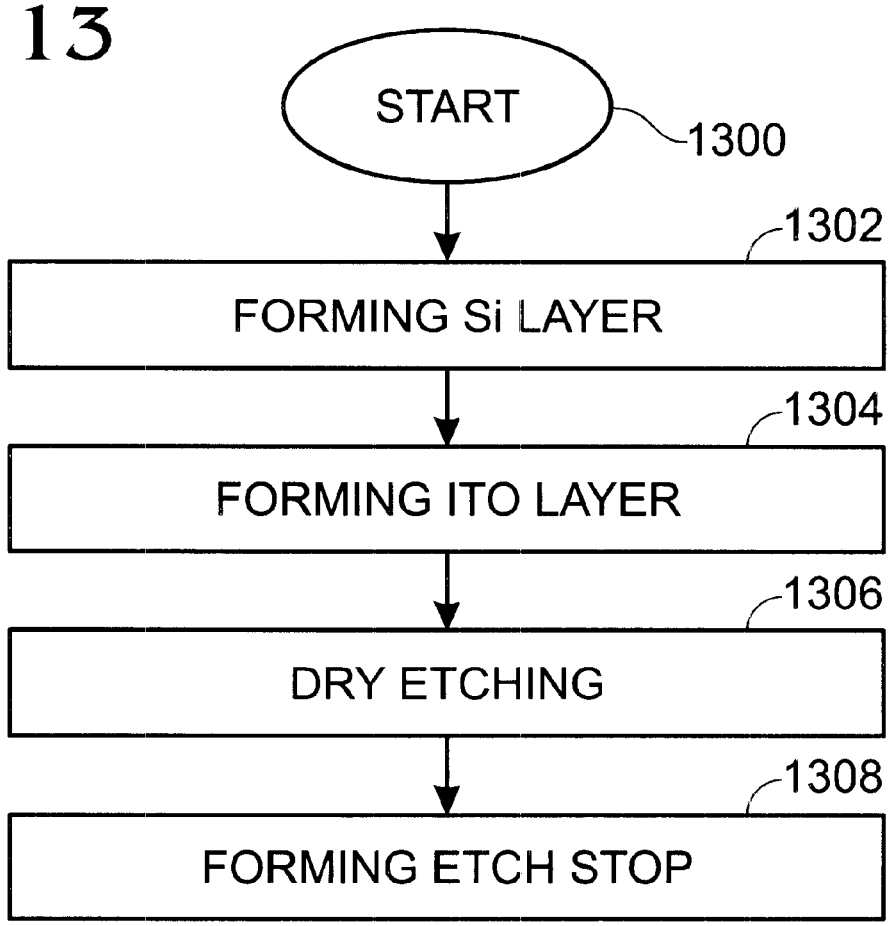
FIG. 13 illustrates a more general application of the present invention method for etching adjoining layers in the fabrication of an integrated circuit.

FIG. 13 illustrates a more general application of the present invention method for etching adjoining layers in the fabrication of an integrated circuit. The method starts at Step 1300. Step 1302 forms a silicon layer. Step 1304 forms a layer of ITO overlying the silicon layer. Step 1306 dry etches the ITO layer to expose the underlying Si layer. In some aspects of the invention the dry etching in Step 1306 removes the exposed Si layer, or a portion of the Si layer, in the same process step that removes the exposed ITO layer. In some aspects of the invention photoresist is deposited and patterned to select the areas of ITO film to be etched.

Dry etching the ITO layer includes dry etching in an atmosphere selected from the group of dry etching gas atmospheres substantially including HI, HBr, HCl, HI and Ar, $Cl_2$ and He, $CF_3Cl$, $CF_2Cl_2$, $SiCl_4$, $SiBr_4$, and combinations of the above-mentioned gases. When greater selectivity to silicon is desired, Step 1306 includes dry etching in an atmosphere selected from the group of atmospheres including at least 10% oxygen, at least 10% nitrogen, and a combination of at least 10% oxygen and nitrogen (percentage by volume in the gas feed). Dry etching the ITO layer further includes dry etching with a process tool selected from the group including transform coupled plasma (TCP), inductively coupled plasma (ICP), and electron cyclotron resonance (ECR) tools.

In some aspects of the invention Step 1306 includes introducing the atmosphere selected from the group of atmospheres including at least 10% oxygen, at least 10% nitrogen, and a combination of at least 10% oxygen and nitrogen, after the etching gas atmosphere is introduced. Then, a further step, Step 1308 forms an etch-stop layer selected from the group including silicon dioxide ($SiO_2$) and silicon nitride overlying the Si layer. In some aspects forming an etch-stop layer overlying the exposed silicon layer typically includes minimally etching the exposed Si layer. Alternately, the process can be adjusted to etch a substantial portion of the Si layer before the etch-stop layer is formed, or completely remove the silicon.

The objective of the invention is to improve selectivity for ITO dry etching to underlayers such as a-Si, $\mu$c-Si (microcrystalline silicon), p-Si (polycrystalline silicon), SiN, and SiO by using an additional gas (besides the conventional dry etching gases) to improve the Si etching selectivity. The application of the present invention process can eliminate several process steps in the fabrication of a bottom gate AM LCD. However, this same process is more generally applicable to other IC processes, and can also be used in the fabrication of top gate AM LCD TFTs.

Since the selectivity of ITO dry etching to Si underlayers is poor, ITO has conventionally been etched by wet solution to insure a good selectivity to the silicon. However, when the present invention process is used, three layers (source metal, ITO, and channel silicon) can be etched using the same equipment in a single process. Even the following half ashing step can be performed in situ using the same plasma equipment.

Experimental Results

In a series of experiments HI gas was chosen as the main etching gas. Oxygen or nitrogen was added to improve the selectivity of ITO to Si (n+ Si, pc-Si, or a-Si). The additional oxygen or nitrogen reacted with the silicon surface during dry etching, and an etch-stop of silicon oxide, silicon dioxide, silicon nitride, or combinations of these barrier materials was formed on the top of silicon.

Figure 14:
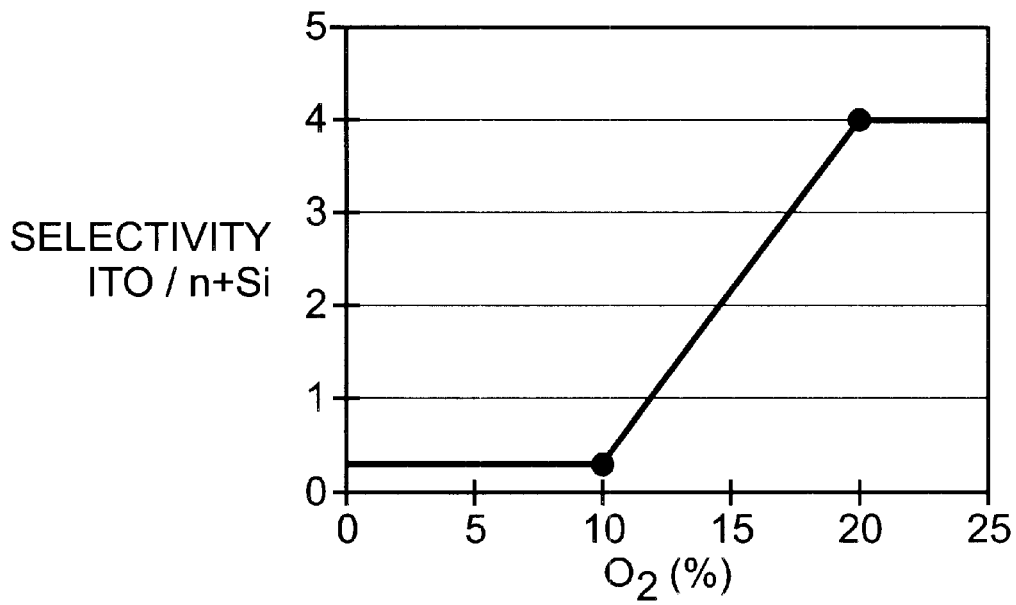
FIG. 14 is a graph depicting the improved selectivity of ITO to n+ silicon when oxygen is added to HI.

FIG. 14 is a graph depicting the improved selectivity of ITO to n+ silicon when oxygen is added to HI. When greater than 10% oxygen (percentage by volume in the gas feed) is added, the improvement in selectivity is significant.

Figure 15:
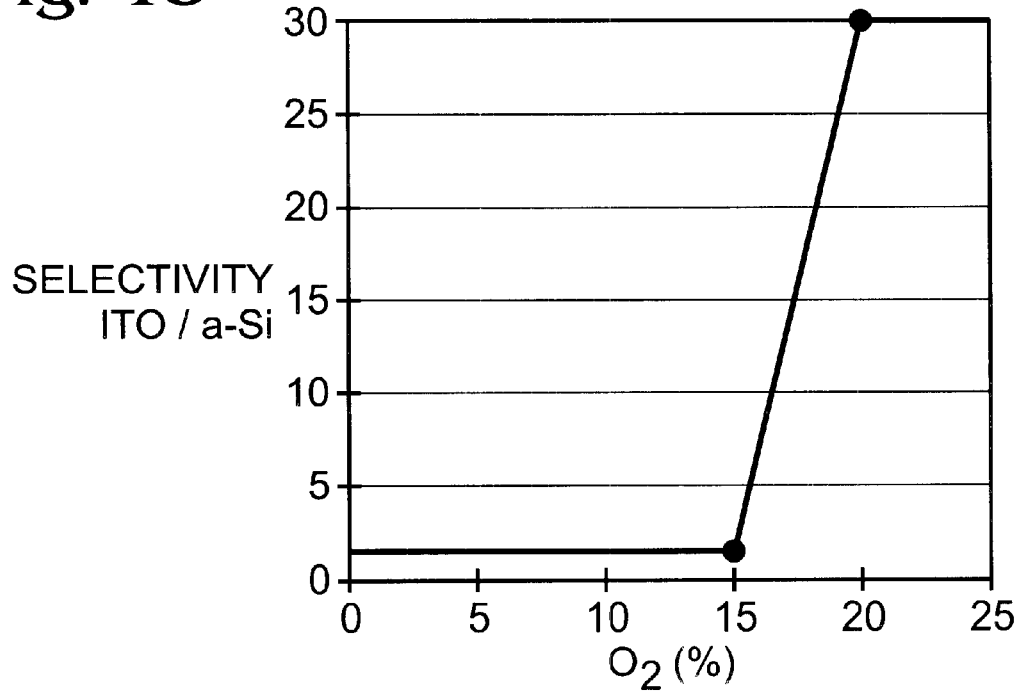
FIG. 15 is a graph depicting the improved selectivity of ITO to amorphous silicon when oxygen is added to HI.

FIG. 15 is a graph depicting the improved selectivity of ITO to amorphous silicon when oxygen is added to HI. When greater than 15% oxygen is added, the improvement in selectivity is significant.

Figure 16:
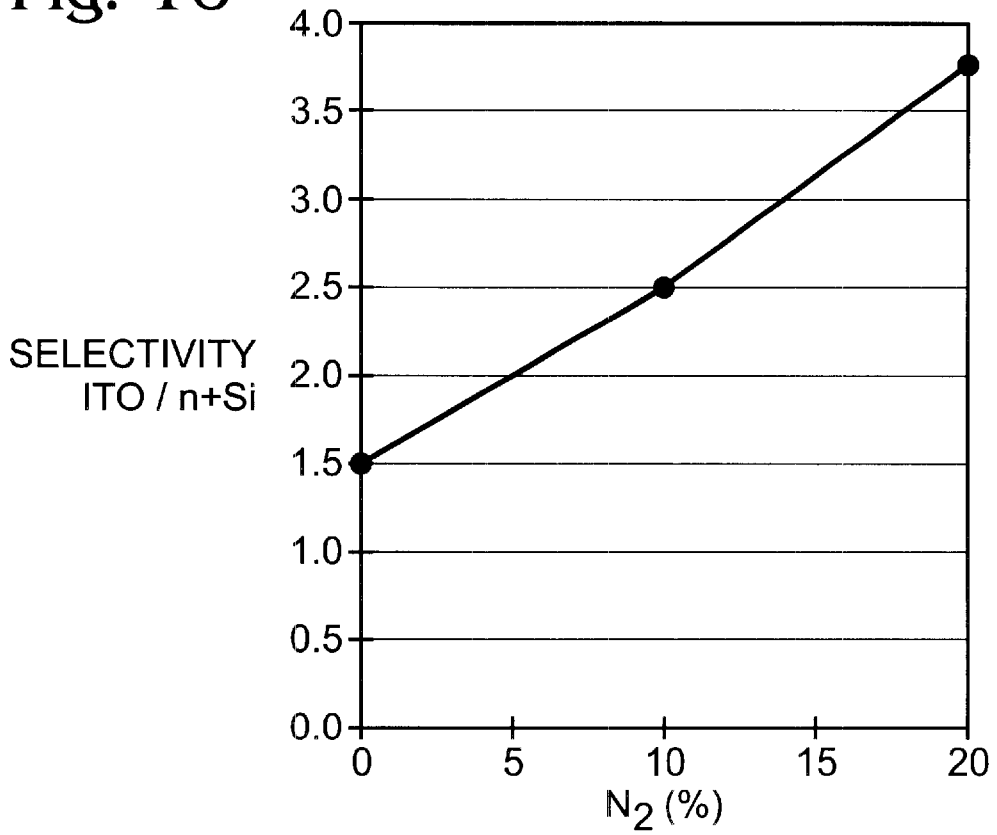
FIG. 16 is a graph depicting the improved selectivity of ITO to n+ silicon when nitrogen ($N_2$) is added to HI.

FIG. 16 is a graph depicting the improved selectivity of ITO to n+ silicon when nitrogen ($N_2$) is added to HI. A consistent improvement in selectivity is noted as increasing larger amounts of nitrogen are added to the etching gas.

Figure 17:
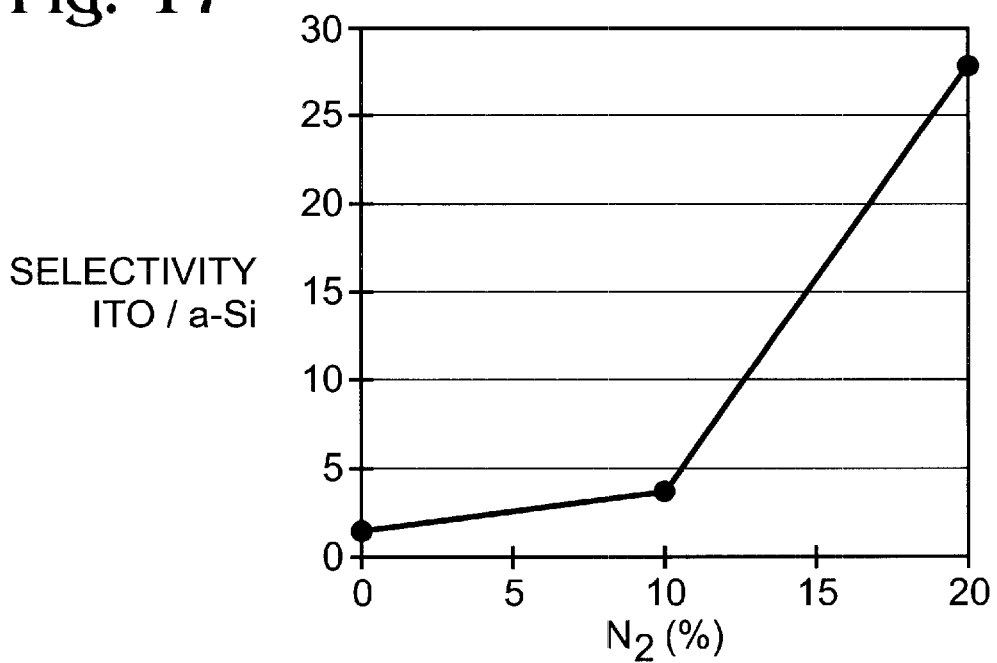
FIG. 17 is a graph depicting the improved selectivity of ITO to amorphous silicon when nitrogen is added to HI.

FIG. 17 is a graph depicting the improved selectivity of ITO to amorphous silicon when nitrogen is added to HI. When greater than 10% nitrogen is added, the improvement in selectivity is significant.

A method has been provided for etching adjoining layers of ITO and silicon in one continuous process. Examples have been provided of a general process, and of a more specific bottom gate TFT fabrication process. A process of forming a top gate TFT through a combined dry etching process would be equivalent. Other variations and embodiments of the above-described method will occur to those skilled in the art.

We claim:

1. A method for etching adjoining layers, the method comprising:
    forming a silicon (Si) layer;
    forming a layer of indium tin oxide (ITO) overlying the silicon layer; and
    dry etching the ITO layer to expose the underlying Si layer in an atmosphere including a halogen gas selected from the group including Cl, F, I, and Br, thereby forming an etch-stop layer overlying the silicon layer.

2. The method of claim 1 wherein dry etching the ITO layer includes dry etching in an atmosphere selected from the group of atmospheres including at least 10% oxygen, at least 10% nitrogen, and a combination of at least 10% oxygen and nitrogen, where percentage is defined as percentage by volume in the gas feed.

3. The method of claim 2 wherein dry etching the ITO layer includes dry etching in an atmosphere selected from the group of dry etching gas atmospheres substantially including HI, HBr, HCl, HI and Ar, $Cl_2$ and He, $CF_3Cl$, $CF_2Cl_2$, $SiCl_4$, $SiBr_4$, and combinations of the above-mentioned gases.

4. The method of claim 3 wherein dry etching the ITO layer includes introducing a gas selected from the group of atmospheres including at least 10% oxygen, at least 10% nitrogen, and a combination of at least 10% oxygen and nitrogen, after the dry etching gas atmosphere is introduced; and
    the method further comprising:
        after the introduction of the dry etching gas, forming an etch-stop layer selected from the group including silicon dioxide ($SiO_2$) and silicon nitride overlying the Si layer.

5. The method of claim 4 wherein forming an etch-stop layer overlying the exposed silicon layer includes etching the exposed Si layer.

6. The method of claim 3 wherein dry etching the ITO layer includes dry etching with a process tool selected from the group including transform coupled plasma (TCP), inductively coupled plasma (ICP), and electron cyclotron resonance (ECR) tools.

7. The method of claim 3 wherein dry etching the ITO layer to expose the underlying Si layer includes dry etching the exposed Si layer.

8. A method for etching adjoining layers, the method comprising:
    forming a silicon (Si) layer;
    forming a layer of indium tin oxide (ITO) overlying the silicon layer;
    dry etching the ITO layer in an atmosphere selected from the group of atmospheres including more than 10% oxygen, more than 10% nitrogen, and more than a 10% combination of oxygen and nitrogen, where percentage is defined as percentage by volume in the gas feed; and
    in response to the dry, etching, forming an etch-stop layer from a material selected from the group including silicon dioxide ($SiO_2$) and silicon nitride overlying the Si layer.

9. In the fabrication of an integrated circuit thin film transistor (TFT) electrode, a method for etching adjoining film layers, the method comprising:

forming a first silicon layer;

forming a second silicon layer overlying the first silicon layer;

forming a layer of indium tin oxide (ITO) overlying the second silicon layer;

forming a metal layer overlying the ITO layer; and dry etching to remove the metal layer, the ITO layer, and the second silicon layer in an atmosphere including a halogen gas selected from the group including Cl, F, I, and Br, thereby forming an etch-stop layer overlying the first silicon layer.

10. The method of claim 9 wherein dry etching includes:

dry etching in a first atmosphere to remove the metal layer, the ITO layer, and the second silicon layer; and dry etching in a second atmosphere to promote the formation of the etch-stop layer in the first silicon layer.

11. The method of claim 10 wherein dry etching in the second atmosphere includes dry etching in a second atmosphere selected from the group of atmospheres including more than 10% oxygen, more than 10% nitrogen, and more than 10% of a combination of oxygen and nitrogen, where percentage is defined as percentage by volume in the gas feed.

12. The method of claim 11 wherein forming the etch-stop layer includes forming an etch-stop layer from a material selected from the group including silicon dioxide ($SiO_2$) and silicon nitride.

13. The method of claim 12 wherein dry etching in the first and second atmospheres includes dry etching in an atmosphere selected from the group of dry etching gas atmospheres substantially including HI, HBr HCl, HI and Ar, $Cl_2$ and He, $CF_3Cl$, $CF_2Cl_2$, $SiCl_4$, $SiBr_4$, and combinations of the above-mentioned gases.

14. The method of claim 13 wherein forming an etch-stop layer overlying the first silicon layer includes etching the first Si layer.

15. The method of claim 14 wherein forming a first silicon layer includes forming an amorphous silicon layer; and wherein forming a second silicon layer includes forming a doped microcrystalline silicon layer.

16. The method of claim 15 wherein forming a doped microcrystalline silicon layer includes doping with an n+ material; and wherein forming a metal layer includes forming a source metal layer.

17. The method of claim 16 further comprising:

following the forming of the metal layer, patterning a layer of photoresist having an opening to expose a region of the metal layer; and wherein dry etching includes dry etching the exposed metal layer region, a region of the ITO layer underlying the exposed metal layer region, and a region of the second silicon layer underlying the ITO region.

18. The method of claim 17 further comprising:

following the dry etching of the second atmosphere to promote the formation of an etch-stop layer, etching to remove the etch-stop layer.

19. The method of claim 18 wherein etching to remove the etch-stop layer includes etching with a plasma selected from the group including $CF_4$, $CF_3H$, $CF_2H_2$, and $SF_6$ plasmas.

20. The method of claim 17 further comprising:

half ashing the exposed surfaces using an $O_2$ plasma to partially remove the photoresist.

21. The method of claim 17 wherein dry etching in the first and second atmospheres includes dry etching with a process tool selected from the group including transform coupled plasma (TCP), inductively coupled plasma (ICP), and electron cyclotron resonance (ECR) tools.

* * * * *